(12) United States Patent
Lin et al.

(10) Patent No.: US 8,096,182 B2
(45) Date of Patent: Jan. 17, 2012

(54) CAPACITIVE SENSOR WITH STRESS RELIEF THAT COMPENSATES FOR PACKAGE STRESS

(75) Inventors: Yizhen Lin, Gilbert, AZ (US); Andrew C. McNeil, Chandler, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 902 days.

(21) Appl. No.: 12/129,548

(22) Filed: May 29, 2008

(65) Prior Publication Data
US 2009/0293616 A1    Dec. 3, 2009

(51) Int. Cl.
*G01P 15/125*    (2006.01)

(52) U.S. Cl. .................... 73/514.32; 29/592.1

(58) Field of Classification Search ............ 73/488, 73/503, 504.03, 509, 510, 514.01, 514.32; 29/592.1
See application file for complete search history.

(56) References Cited

U.S. PATENT DOCUMENTS

| | | | | |
|---|---|---|---|---|
| 4,736,629 A * | 4/1988 | Cole | ........... | 73/514.32 |
| 5,487,305 A * | 1/1996 | Ristic et al. | ........... | 73/514.32 |
| 5,563,343 A * | 10/1996 | Shaw et al. | ........... | 73/514.18 |
| 5,594,171 A * | 1/1997 | Ishida et al. | ........... | 73/514.32 |
| 5,610,335 A * | 3/1997 | Shaw et al. | ........... | 73/514.36 |
| 5,806,365 A * | 9/1998 | Zunino et al. | ........... | 73/514.16 |
| 5,962,787 A * | 10/1999 | Okada et al. | ........... | 73/514.32 |
| 6,009,757 A * | 1/2000 | LeComte et al. | ........... | 73/724 |
| 6,051,866 A * | 4/2000 | Shaw et al. | ........... | 257/417 |
| 6,159,761 A * | 12/2000 | Okada | ........... | 438/53 |
| 6,239,473 B1 * | 5/2001 | Adams et al. | ........... | 257/419 |
| 6,318,174 B1 * | 11/2001 | Schmiesing et al. | ........... | 73/510 |
| 6,342,430 B1 * | 1/2002 | Adams et al. | ........... | 438/424 |
| 6,701,786 B2 * | 3/2004 | Hulsing, II | ........... | 73/514.02 |
| 6,792,804 B2 * | 9/2004 | Adams et al. | ........... | 73/514.32 |
| 6,936,492 B2 * | 8/2005 | McNeil et al. | ........... | 438/50 |
| 7,430,909 B2 * | 10/2008 | Adams et al. | ........... | 73/510 |
| 7,487,661 B2 * | 2/2009 | Ueda et al. | ........... | 73/1.39 |
| 7,628,072 B2 * | 12/2009 | Koury et al. | ........... | 73/514.32 |

(Continued)

FOREIGN PATENT DOCUMENTS
KR    1019980016188    5/1998

OTHER PUBLICATIONS

An, S., et al.; Dual-Axis Microgyroscope with Closed-Loop Detection; Sensors and Actuators; vol. 73, Issues 1-2; Mar. 9, 1999, pp. 1-6; IEEE.

(Continued)

*Primary Examiner* — Hezron E Williams
*Assistant Examiner* — Samir M Shah
(74) *Attorney, Agent, or Firm* — Meschkow & Gresham, P.L.C.

(57) ABSTRACT

A microelectromechanical systems (MEMS) capacitive sensor (52) includes a movable element (56) pivotable about a rotational axis (68) offset between ends (80, 84) thereof. A static conductive layer (58) is spaced away from the movable element (56) and includes electrode elements (62, 64). The movable element (56) includes a section (74) between the rotational axis (68) and one end (80) that exhibits a length (78). The movable element (56) further includes a section (76) between the rotational axis (68) and the other end (84) that exhibits a length (82) that is less than the length (78) of the section (74). The section (74) includes slots (88) extending through movable element (56) from the end (80) toward the rotational axis (68). The slots (88) provide stress relief in section (74) that compensates for package stress to improve sensor performance.

20 Claims, 3 Drawing Sheets

U.S. PATENT DOCUMENTS

| | | | |
|---|---|---|---|
| 7,637,160 B2* | 12/2009 | Koury et al. | 73/514.32 |
| 7,640,805 B2* | 1/2010 | Diamond et al. | 73/514.32 |
| 7,757,393 B2* | 7/2010 | Ayazi et al. | 29/847 |
| 7,767,483 B1* | 8/2010 | Waters | 438/51 |
| 7,784,344 B2* | 8/2010 | Pavelescu et al. | 73/514.32 |
| 7,793,542 B2* | 9/2010 | Schultz | 73/510 |
| 7,851,876 B2* | 12/2010 | Ramamoorthi et al. | 257/419 |
| 7,863,698 B2* | 1/2011 | Seeger et al. | 257/415 |
| 2001/0047688 A1* | 12/2001 | Woodruff et al. | 73/514.29 |
| 2004/0219340 A1 | 11/2004 | McNeil et al. | |
| 2005/0132804 A1* | 6/2005 | Park et al. | 73/514.32 |
| 2005/0217374 A1* | 10/2005 | Chen et al. | 73/504.04 |
| 2007/0119252 A1 | 5/2007 | Adams et al. | |
| 2007/0170525 A1 | 7/2007 | Eskridge | |

OTHER PUBLICATIONS

Li, X., et al.; A Microgyroscope with Piezoresistance for Both High-Performance Coriolis-Effect Detection and Seesaw-Like Vibration Control; Journal of Microelectromechanical Systems, vol. 15, No. 6, Dec. 2006 pp. 1698-1707; IEEE.

PCT Application No. PCT/US20091036755; Search Report and Written Opinion; mailed Jul. 31, 2009.

* cited by examiner

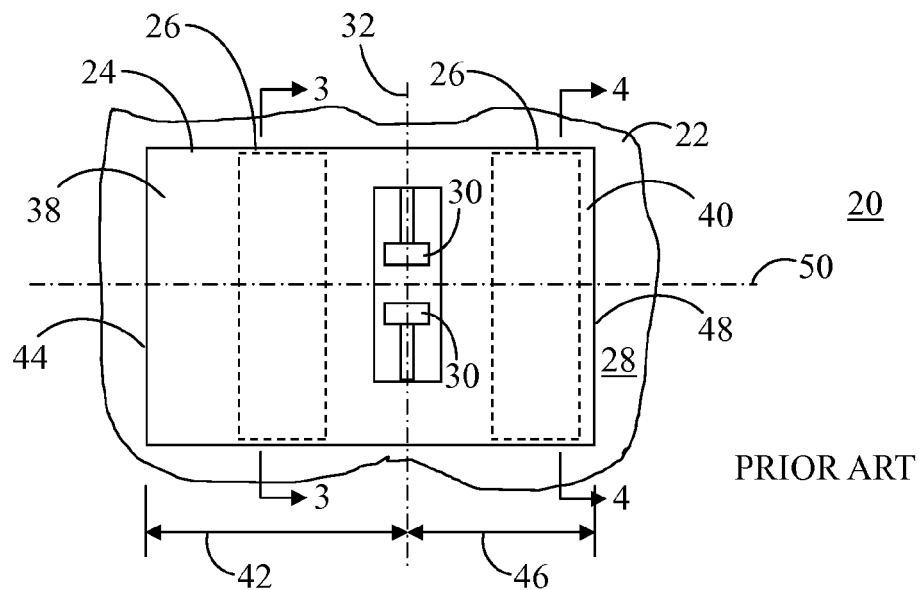
FIG. 1
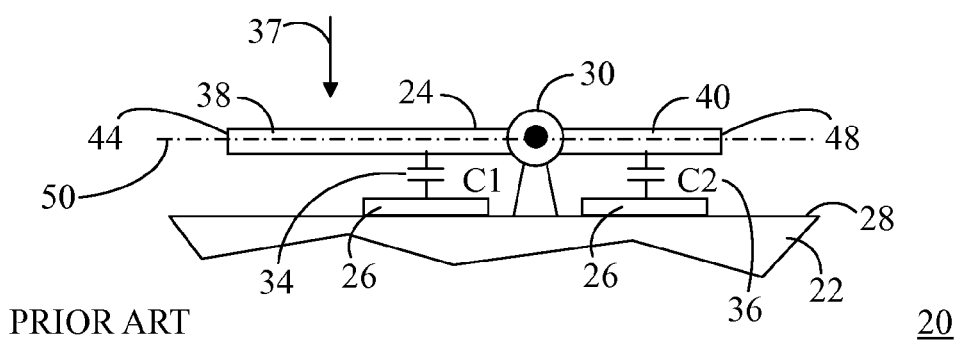
FIG. 2
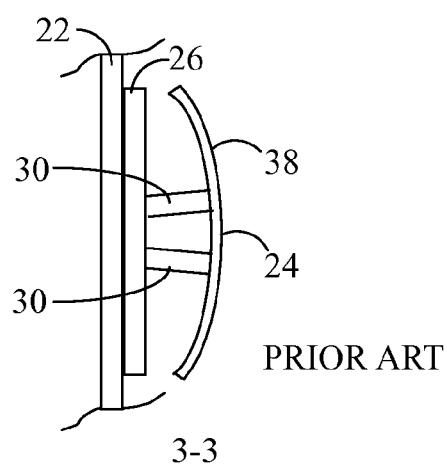 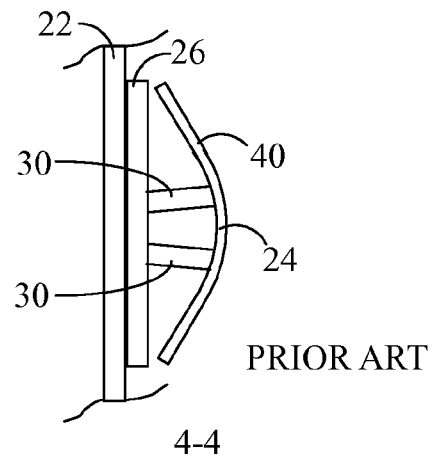
FIG. 3     FIG. 4

US 8,096,182 B2

CAPACITIVE SENSOR WITH STRESS RELIEF THAT COMPENSATES FOR PACKAGE STRESS

TECHNICAL FIELD OF THE INVENTION

The present invention relates generally to microelectromechanical systems (MEMS) sensors. More specifically, the present invention relates to a MEMS differential capacitive accelerometer.

BACKGROUND OF THE INVENTION

An accelerometer is a sensor typically utilized for measuring acceleration forces. These forces may be static, like the constant force of gravity, or they can be dynamic, caused by moving or vibrating the accelerometer. An accelerometer may sense acceleration or other phenomena along one, two, or three axes or directions. From this information, the movement or orientation of the device in which the accelerometer is installed can be ascertained. Accelerometers are used in inertial guidance systems, in airbag deployment systems in vehicles, in protection systems for a variety of devices, and many other scientific and engineering systems.

Capacitive-sensing MEMS accelerometer designs are highly desirable for operation in high gravity environments and in miniaturized devices, due to their relatively low cost. Capacitive accelerometers sense a change in electrical capacitance, with respect to acceleration, to vary the output of an energized circuit. One common form of accelerometer is a capacitive transducer having a "teeter-totter" or "see saw" configuration. This commonly utilized transducer type uses a movable element or plate that rotates under z-axis acceleration above a substrate. The accelerometer structure can measure at least two distinct capacitances to determine differential or relative capacitance.

Referring to FIGS. 1 and 2, FIG. 1 shows a top view of a prior art capacitive-sensing MEMS sensor 20 constructed as a conventional hinged or "teeter-totter" type accelerometer, and FIG. 2 shows a side view of MEMS sensor 20. MEMS sensor 20 includes a static substrate 22 and a movable element 24 spaced from substrate 22, each of which have opposed planar faces. Substrate 22 has a number of conductive electrode elements 26 of a predetermined configuration deposited on a substrate surface 28 to form capacitor electrodes or "plates." In an exemplary scenario, electrode elements 26 may operate as excitation or sensing electrodes to receive stimulating signals. Electrode elements 26 may additionally operate as a feedback electrodes when a feedback signal is superimposed on the sensing signal.

Movable element 24, commonly referred to as a "proof mass," is flexibly suspended above substrate 22 by one or more suspension anchors, or rotational flexures 30, for enabling movable element 24 to pivot or rotate about a rotational axis 32 to form capacitors 34 and 36, labeled C1 and C2, with electrode elements 26. Movable element 24 moves in response to acceleration, thus changing its position relative to the static sensing electrode elements 26. This change in position results in a set of capacitors whose difference, i.e., a differential capacitance, is indicative of acceleration in a direction 37.

When intended for operation as a teeter-totter type accelerometer, a section 38 of movable element 24 on one side of rotational axis 32 is formed with relatively greater mass than a section 40 of movable element 24 on the other side of rotational axis 32. The greater mass of section 38 is typically created by offsetting rotational axis 32. That is, a length 42 between rotational axis 32 and an end 44 of section 38 is greater than a length 46 between rotational axis 32 and an end 48 of section 40. In addition, electrode elements 26 are sized and spaced symmetrically with respect to rotational axis 32 and a longitudinal axis 50 of movable element 24.

Many MEMS sensor applications require smaller size and low cost packaging to meet aggressive cost targets. In addition, MEMS sensor applications are calling for lower temperature coefficient of offset (TCO) specifications. The term "offset" refers to the output deviation from its nominal value at the non-excited state of the MEMS sensor. Thus, TCO is a measure of how much thermal stresses effect the performance of a semiconductor device, such as a MEMS sensor. A high TCO indicates correspondingly high thermally induced stress, or a MEMS device that is very sensitive to such stress. The packaging of MEMS sensor applications often uses materials with dissimilar coefficients of thermal expansion. Thus, an undesirably high TCO often develops during manufacture or operation. These thermal stresses, as well as stresses due to moisture and assembly processes, can result in deformation of the underlying substrate 22, referred to herein as package stress.

Referring to FIGS. 3-4, FIG. 3 shows a cross-sectional edge view of MEMS sensor 20 along section lines 3-3 in FIG. 1, and FIG. 4 shows a cross-sectional edge view of MEMS sensor 20 along section lines 4-4 in FIG. 1. A problem particular to the teeter-totter configuration shown in FIG. 1 is that when teeter totter configuration of MEMS sensor 20 is subject to a bending moment from substrate 22 caused by package stress, the stress causes section 40, i.e., the lighter section, to deform more than section 38, i.e., the heavier section, resulting in an offset change. As illustrated in FIGS. 3 and 4, package stress can result in deformation of section 40 of movable element 24 that is significantly greater than the deformation of section 38 of movable element 24. This nonsymmetric bending induced by package stress can result in an undesirably high offset difference between sense capacitances 34 and 36 (i.e., poor TCO performance), thus adversely affecting capacitive accelerometer 20 output.

Thus, what is needed is a low cost, compact, single die teeter-totter type MEMS sensor that can sense along one or more axes and is less susceptible to thermally induced package stress gradients.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 1 shows a top view of a prior art capacitive-sensing microelectromechanical systems (MEMS) sensor;

FIG. 2 shows a side view of the MEMS sensor of FIG. 1;

FIG. 3 shows a cross-sectional edge view of the MEMS sensor along section lines 3-3 in FIG. 1;

FIG. 4 shows a cross-sectional edge view of the MEMS sensor along section lines 4-4 in FIG. 1;

DETAILED DESCRIPTION

Figure 5:
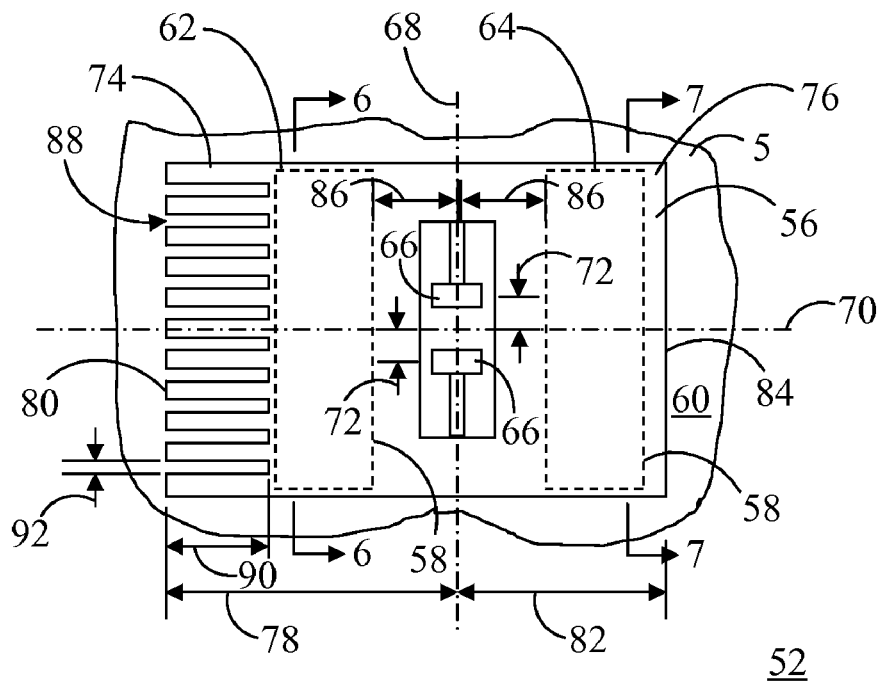
FIG. 5 shows a top view of a microelectromechanical systems (MEMS) sensor in accordance with an embodiment of the invention.

FIG. 5 shows a top view of a microelectromechanical systems (MEMS) sensor 52 in accordance with an embodiment of the invention. Sensor 52 may be, for example, a capacitive-sensing accelerometer or another MEMS sensing device. MEMS sensor 52 is constructed as a hinged or "teeter-totter" type accelerometer. MEMS sensor 52 includes a substrate 54 and a movable element 56 spaced from substrate 54, each of which have opposed planar faces. A static conductive layer 58 is deposited on a surface 60 of substrate 54. Static conductive layer 58 is in the form of at least two electrically isolated electrodes or plates, including, for example, an electrode element 62 and an electrode element 64 (both of which are shown in ghost form). Electrode elements 62 and 64 may operate as excitation or sensing electrodes to receive stimulating signals. Electrode elements 62 and 64 may additionally operate as a feedback electrodes when a feedback signal is superimposed on the sensing signal.

Movable element 56 is suspended above and pivotally coupled to substrate 54 by a pair of suspension anchors 66, or rotational flexures, for enabling movable element 56 to pivot or rotate about a rotational axis 68 to form capacitors (see, for example, FIG. 2) between movable element 56 with respective electrode elements 62 and 64. Only two electrode elements 62 and 64 are shown in FIG. 5 for simplicity of illustration. However, in alternative embodiments, MEMS sensor 52 may include a different quantity and/or different configuration of electrode elements. In addition, it should be understood that a number of flexures, hinges, and other rotational mechanisms may be utilized to enable pivotal movement of movable element 56 about rotational axis 68.

Movable element 56 exhibits an axis of symmetry 70 that is orthogonal to rotational axis 68. An axis of symmetry is a line in a geometric figure which divides the figure into two parts such that one part, when folded over along the axis of symmetry, coincides with the other part. Accordingly, MEMS sensor 52 exhibits an equivalent size and placement of its components on either side of axis of symmetry 70. In one embodiment, each of suspension anchors 66 is offset an equivalent distance 72 on opposing sides of axis of symmetry 70.

A section 74 of movable element 56 on one side of rotational axis 68 is formed with relatively greater mass than a section 76 of movable element 56 on the other side of rotational axis 68. The greater mass of section 74 is created by offsetting rotational axis 68. That is, a length 78 between rotational axis 68 and an end 80 of section 74 is greater than a length 82 between rotational axis 68 and an end 84 of section 76. Electrode element 62 faces section 74 of movable element 56 and electrode element 64 faces section 76 of movable element 56. In addition, electrode elements 62 and 64 are sized and spaced symmetrically with respect to rotational axis 68 and longitudinal axis of symmetry 70 of movable element 56. That is, each of electrode elements 62 and 64 is offset an equivalent distance 86 on opposing sides of rotational axis 68, and each of electrode elements 62 and 64 extends an equivalent distance on either side of axis of symmetry 70.

Movable element 56 moves in response to acceleration in direction 37 (FIG. 2), thus changing its position relative to the static electrode elements 62 and 64. Thus, electrode elements 62 and 64 are adapted to detect movement of movable element along an axis that is perpendicular to a plane of electrode elements 62 and 64. This change in position results in a set of capacitors whose difference, i.e., a differential capacitance, is indicative of acceleration in direction 37. The term "static" utilized herein refers to conductive layer 58 and electrode elements 62 and 64 that are stationary relative to movable element 56. That is, while movable element 56 may rotate or pivot on suspension anchors 66 about rotational axis 68, conductive layer 58 (including electrode elements 62 and 64) does not pivot, rotate, or otherwise move relative to movable element 56. FIG. 1 shows one possible configuration of MEMS sensor 52. However, it should be understood that MEMS sensor 52 can take on a number of two- and/or three-layer forms.

Section 74 includes slots 88 extending through movable element 56. In an embodiment, each of slots 88 extends from end 80 of section 74 toward rotational axis 68. Each of slots 88 exhibits a dimension, referred to as a length 90, and another dimension, referred to as a width 92. In addition, slots 88 are uniformly distributed on opposing sides of longitudinal axis of symmetry 70. That is, there is an equivalent quantity of slots 88 arranged on either side of axis of symmetry 70 that are also offset from axis of symmetry 70 by equivalent distances. Although an embodiment of MEMS sensor 52 illustrated herein includes an even quantity of slots 88 formed on opposing sides of axis of symmetry 70, in another embodiment, MEMS sensor 52 may include an odd number of slots 88. In such a configuration, one of slots 88 would thus be centered on axis of symmetry 70. In addition, although generally rectangular slots 88 are illustrated herein, other shapes such as a sawtooth or triangular shape, may alternatively be utilized.

Figure 6:
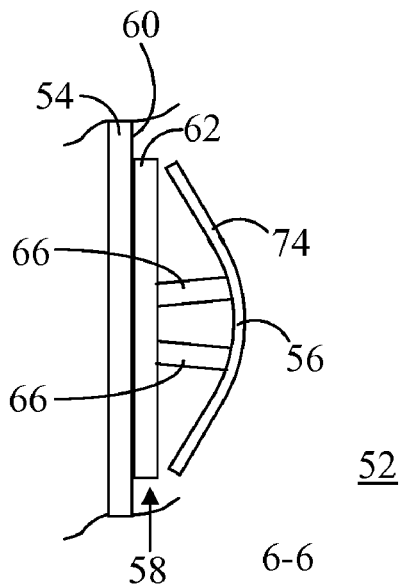
FIG. 6 shows a cross-sectional edge view of the MEMS sensor along section lines 6-6 in FIG. 5.
Figure 7:
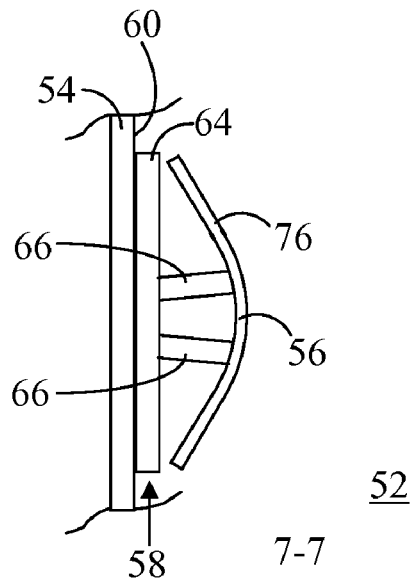
FIG. 7 shows a cross-sectional edge view of the MEMS sensor along section lines 7-7 in FIG. 5.

A function of slots 88 is to reduce the bending moment of inertia of section 74 caused by package stress. As a result, the bending moment of inertia between section 74 and section 76 are more closely matched. Referring to FIGS. 6 and 7, FIG. 6 shows a cross-sectional edge view of MEMS sensor 52 along section lines 6-6 in FIG. 5, and FIG. 7 shows a cross-sectional edge view of MEMS sensor 52 along section lines 7-7 in FIG. 5. As illustrated in FIGS. 6 and 7, due to the presence of slots 88 in the "heavy end" (i.e., section 74) package stress results in deformation of section 74 of movable element 56 that is approximately equivalent to the deformation of section 76 of movable element 56 on an opposing side of axis of rotation 68. This generally symmetric bending of movable element 56 induced by package stress results in an offset difference that is significantly less than that seen in prior art MEMS sensors, such as MEMS sensor 20 (FIG. 1). Accordingly, TCO performance is correspondingly improved leading to more accurate acceleration output of MEMS sensor 52.

A method of fabricating MEMS sensor 82 may entail the provision of substrate 54. In accordance with conventional and upcoming MEMS sensor manufacturing processes, substrate 54 may be a semiconductor wafer comprising silicon, although any mechanically supporting substrate may be utilized. An insulating layer (not shown) may be formed on surface 60 of substrate 54. The insulating layer may be silicon dioxide, silicon nitride, and the like. The insulating layer may be formed conformally and then patterned and etched. It functions to insulate static conductive layer 58 from substrate 54. It should be understood, however, that if substrate 54 is nonconductive, an insulating layer may not be utilized.

Static conductive layer 58 may comprise polysilicon, although other conductive materials may be employed. Static conductive layer 58 may be formed by known methods such as deposition and sputtering. Static conductive layer 58 may be deposited over surface 60 of substrate 54 as a blanket layer and can then be patterned and etched to form electrode elements 62 and 64. A protective layer (not shown) may optionally be disposed over static conductive layer 58 and patterned and etched as desired to protect substrate 54 during future processing steps and to prevent shorting and/or welding between static conductive layer 58 and movable element 56.

A sacrificial layer (not shown) may be formed on the patterned and etched static conductive layer 58. Like previous layers, the sacrificial layer may also be formed conformally and then patterned and etched as desired. The sacrificial layer may be formed of phosphosilicate glass and can be deposited by chemical vapor deposition, as known to those skilled in the art. It should be understood that other sacrificial materials may be employed in lieu of phosphosilicate glass.

The next conductive layer, i.e., movable element 56, may comprise polysilicon and is formed as a teeter-totter structure positioned over static conductive layer 58. Movable element 56 is mechanically coupled to substrate 54 by suspension anchors 66. Movable element 56 may be formed by known methods such as deposition and sputtering. As such, movable element 56 may be deposited over the sacrificial layer as a blanket layer and can then be patterned and etched to form slots 88 of length 90 and width 92 extending from end 80 of movable element 56 toward rotational axis 68.

Following the formation of the above described structure, the sacrificial layer is removed in accordance with conventional procedures. For example, a selective etchant may be employed that can remove the phosphosilicate glass sacrificial layer without appreciably damaging the polysilicon of static conductive layer 58, movable element 56, and suspension anchors 66. Following etching, movable element 56 and a rotational portion of suspension anchors 66 is released from the underlying substrate 54.

Prior to formation of slots 88 in section 74, section 74 exhibits a mass that is greater than the mass of section 74 following the formation of slots 88. The mass of section 74 decreases following formation of slots 88 because of the loss of material at slots 88. However, in an embodiment of the invention, the slots are small enough that material loss results in a mass reduction of section 74 of approximately two to five percent less than the mass of section 74 prior to formation of slots 88. Since the formation of slots 88 only slightly decreases the mass of section 74, there is negligible change to the sensitivity of MEMS sensor 52. For example, in one embodiment, width 92 of each of slots 88 may be approximately one and a half microns with a fifty-two micron pitch, which only reduces sensitivity of MEMS sensor by approximately three percent.

Figure 8:
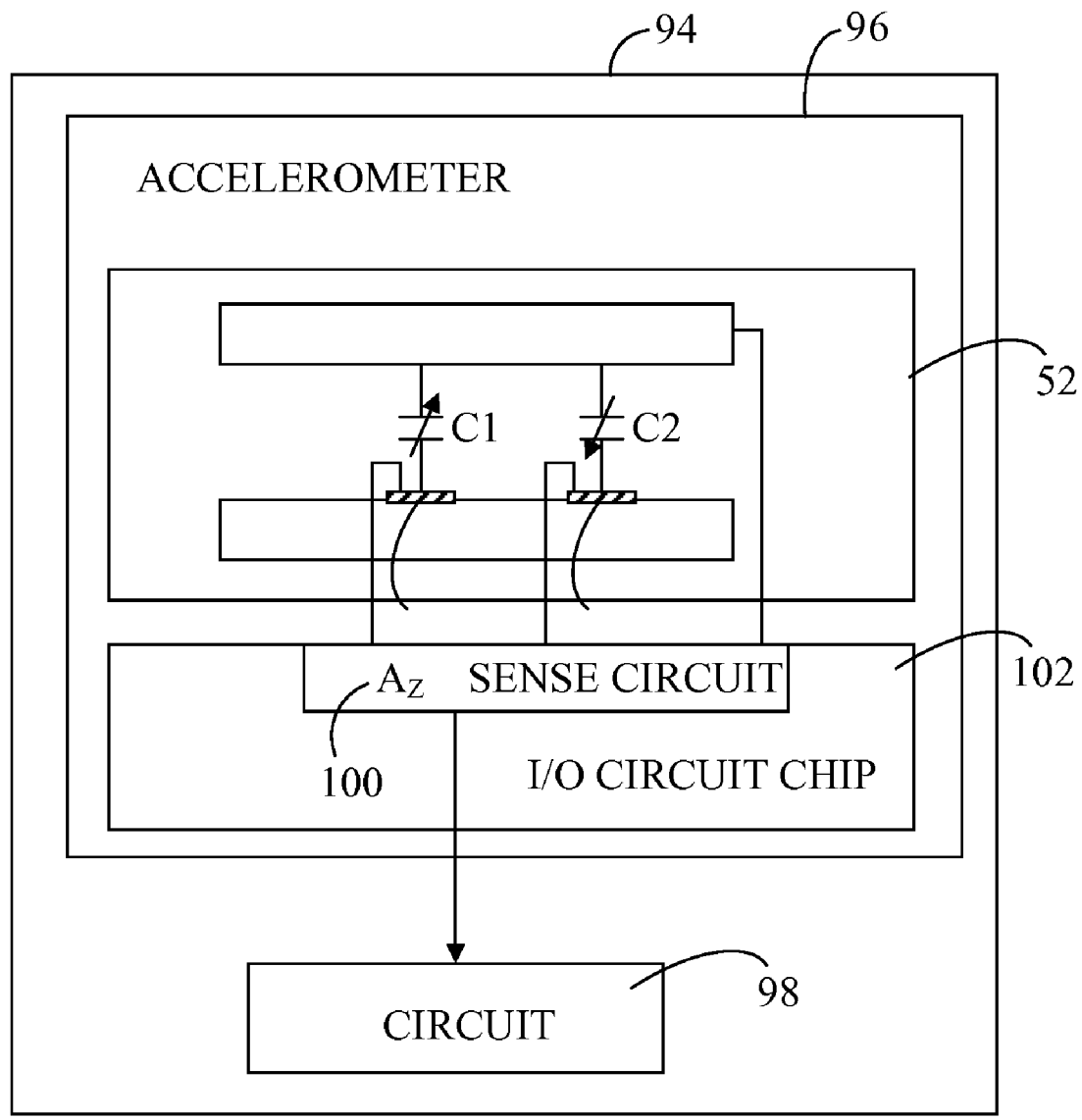
FIG. 8 shows a device in which the MEMS sensor may be installed.

FIG. 8 shows a device 94 in which MEMS sensor 52 may be incorporated. Device 94 can be any of a number of devices such as a vehicle dynamic control system, an inertial guidance system, an airbag deployment system in a vehicle, a protection system for a variety of devices, and many other scientific and engineering systems. MEMS sensor 52 may be a single axis accelerometer capable of sensing acceleration along an axis that is perpendicular to a plane of electrode elements 62 and 64 (FIG. 5).

Device 94 may include an accelerometer package 96 into which MEMS sensor 52 is incorporated. In this exemplary situation, accelerometer package 96 is in communication with a circuit 98, which may include, for example, a processor, hard disk drive, and other components that are interconnected via conventional bus structures known to those skilled in the art. Those skilled in the art will recognize that device 94 may include many other components that are not discussed herein for brevity. Furthermore, device 94 need not have the structures specified herein. In this example, circuit 98 monitors signals from accelerometer package 96. These signals can include acceleration in direction 37 (FIG. 2). An acceleration signal 100 is output from MEMS sensor 52 and is communicated to a sense circuit of an input/output circuit chip 102 for suitable processing, as known to those skilled in the art, prior to output to circuit 98. The acceleration signal 100 has a parameter magnitude (e.g. voltage, current, frequency, etc.) that is dependent on the acceleration. However, the inclusion of slots 88 (FIG. 5) largely reduces any non-symmetric bending of movable element 56 on opposing sides of axis of rotation (FIG. 5) so that acceleration signal 100 more accurately reflects acceleration in direction 37 (FIG. 2).

An embodiment described herein comprises a device that includes a differential capacitive MEMS sensor. Another embodiment comprises a method of fabricating the microelectromechanical systems sensor of the present invention. The sensor may be a differential accelerometer fabricated as a teeter-totter structure, i.e., a movable element. Slots are formed in the heavier end of the movable element distal from and extending toward the rotational axis of the movable element. Due to the presence of the slots in the "heavy end" of the movable element, package stress results in a more symmetric deformation of the movable element on either side of the rotational axis. This symmetric bending of the movable element results in an offset difference that is significantly less than that seen in prior art MEMS sensors. Accordingly, the effects of package stress is greatly decreased, leading to correspondingly improved TCO performance and more accurate acceleration output of the MEMS sensor.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A device comprising:
   a microelectromechanical systems (MEMS) sensor, said sensor comprising:
      a movable element adapted for motion relative to a rotational axis offset between first and second ends thereof to form a first section between said rotational axis and said first end and a second section between said rotational axis and said second end, said first section exhibiting a first length between said rotational axis and said first end that is greater than a second length between said rotational axis and said second end, said first section including slots extending through said movable element; and
      a static conductive layer spaced away from said moveable element, said static conductive layer including a first electrode element and a second electrode element, said first electrode element facing said first section and said second electrode element facing said second section of said movable element.

2. A device as claimed in claim 1 wherein each of said slots extends from said first end of said first section toward said rotational axis.

3. A device as claimed in claim 1 wherein each of said slots exhibits a first dimension and a second dimension, said first dimension being greater than said second dimension, and said first dimension being aligned with said first length.

4. A device as claimed in claim 1 wherein said movable element exhibits an axis of symmetry that is orthogonal to said rotational axis, and said slots are uniformly distributed on opposing sides of said axis of symmetry.

5. A device as claimed in claim 1 wherein said first section exhibits a first mass prior to formation of said slots in said first section, said first section exhibits a second mass following formation of said slots in said first section, said second mass being in a range of two to five percent less than said first mass.

6. A device as claimed in claim 1 wherein said MEMS sensor further comprises:
   a substrate; and
   a pair of suspension anchors formed on a surface of said substrate, said suspension anchors pivotally coupling said movable element to said substrate at said rotational axis.

7. A device as claimed in claim 6 wherein said movable element exhibits an axis of symmetry that is orthogonal to said rotational axis, and each of said pair of suspension anchors is offset on opposing sides of said axis of symmetry by an equivalent distance.

8. A device as claimed in claim 1 wherein said first and second electrode elements are symmetrically arranged relative to said rotational axis.

9. A device as claimed in claim 1 wherein said first and second electrode elements form respective first and second capacitors with said first and second sections of said movable element.

10. A device as claimed in claim 1 wherein said first and second electrode elements are adapted to detect movement of said movable element along an axis perpendicular to a plane of said electrodes.

11. A method of fabricating a microelectromechanical systems (MEMS) sensor comprising:
   providing a substrate;
   forming a static conductive layer on said substrate to include a first electrode element and a second electrode element;
   forming a sacrificial layer on said static conductive layer;
   forming a movable element on said sacrificial layer adapted for motion relative to a rotational axis offset between first and second ends thereof to form a first section between said rotational axis and said first end and a second section between said rotational axis and said second end, said first section exhibiting a first length between said rotational axis and said first end that is greater than a second length between said rotational axis and said second end, wherein forming said movable element includes forming slots in said first section extending through said movable element; and
   selectively removing said sacrificial layer such that said conductive layer is spaced away from said movable element, said conductive layer being formed such that said first electrode element faces said first section and said second electrode element faces said second section of said movable element.

12. A method as claimed in claim 11 further comprising forming each of said slots at said first end of said first section and extending toward said rotational axis.

13. A method as claimed in claim 11 further comprising forming each of said slots to include a first dimension and a second dimension, said first dimension being greater than said second dimension, and said first dimension being aligned with said first length.

14. A method as claimed in claim 11 wherein forming said movable element includes forming said movable element so that said movable element has an axis of symmetry that is orthogonal to said rotational axis, and said slots are uniformly distributed on opposing sides of said axis of symmetry.

15. A method as claimed in claim 11 further comprising pivotally supporting said movable element on a pair of suspension elements positioned along said rotational axis.

16. A method as claimed in claim 15 wherein forming said movable element include forming said movable element so that said movable element has an axis of symmetry that is orthogonal to said rotational axis, and each of said pair of suspension anchors are offset on opposing sides of said axis of symmetry by an equivalent distance.

17. A microelectromechanical systems (MEMS) sensor comprising:
   a substrate;
   a movable element adapted for motion relative to a rotational axis offset between first and second ends thereof to form a first section between said rotational axis and said first end and a second section between said rotational axis and said second end, said first section exhibiting a first length between said rotational axis and said first end that is greater than a second length between said rotational axis and said second end, said first section including slots extending through said movable element, each of said slots extending from said first end of said first section toward said rotational axis;
   at least one suspension anchor formed on a surface of said substrate, said at least one suspension anchor pivotally coupling said movable element to said substrate at said rotational axis; and
   a static conductive layer spaced away from said moveable element, said static conductive layer including a first electrode element and a second electrode element, said first electrode element facing said first section and said second electrode element facing said second section of said movable element.

18. A MEMS sensor as claimed in claim 17 wherein each of said slots exhibits a first dimension and a second dimension, said first dimension being greater than said second dimension, and said first dimension being aligned with said first length.

19. A MEMS sensor as claimed in claim 17 wherein said movable element exhibits an axis of symmetry that is orthogonal to said rotational axis, and said slots are uniformly distributed on opposing sides of said axis of symmetry.

20. A MEMS sensor as claimed in claim 17 wherein said movable element exhibits an axis of symmetry that is orthogonal to said rotational axis, said at least one suspension anchor includes a pair of suspension anchors, and each of said pair of suspension anchors is offset on an opposing side of said axis of symmetry by an equivalent distance.

* * * * *